United States Patent
He et al.

(10) Patent No.: US 7,110,263 B2
(45) Date of Patent: Sep. 19, 2006

(54) REFERENCE SLOTS FOR SIGNAL TRACES

(75) Inventors: Jiangqi He, Gilbert, AZ (US);
Joong-ho Kim, Phoenix, AZ (US);
Hyunjun Kim, Chandler, AZ (US);
Dong-ho Han, Phoenix, AZ (US); Ping Sun, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 10/797,753

(22) Filed: Mar. 9, 2004

(65) Prior Publication Data

US 2005/0201072 A1    Sep. 15, 2005

(51) Int. Cl.
*H05K 1/11* (2006.01)

(52) U.S. Cl. .................................................. 361/794
(58) Field of Classification Search ............... 361/794
See application file for complete search history.

(56) References Cited

U.S. PATENT DOCUMENTS

| | | | | |
|---|---|---|---|---|
| 5,272,600 A | * | 12/1993 | Carey | 361/792 |
| 5,547,405 A | * | 8/1996 | Pinney et al. | 439/894 |
| 5,828,555 A | * | 10/1998 | Itoh | 361/784 |
| 6,384,341 B1 | * | 5/2002 | Rothermel et al. | 174/255 |
| 6,731,493 B1 | | 5/2004 | Zhong et al. | |
| 6,784,532 B1 | | 8/2004 | Zhong et al. | |
| 6,803,649 B1 | | 10/2004 | He et al. | |

* cited by examiner

*Primary Examiner*—Randy W. Gibson
*Assistant Examiner*—Yuriy Semenenko
(74) *Attorney, Agent, or Firm*—Schwabe, Williamson & Wyatt, PC

(57) ABSTRACT

An apparatus comprises a signal layer including a first and second signal trace. The apparatus also comprises a first reference plane including a first slot substantially parallel to the first and second signal traces. Further, the apparatus includes a dielectric layer having at least a portion disposed between the signal layer and the first reference plane.

17 Claims, 7 Drawing Sheets

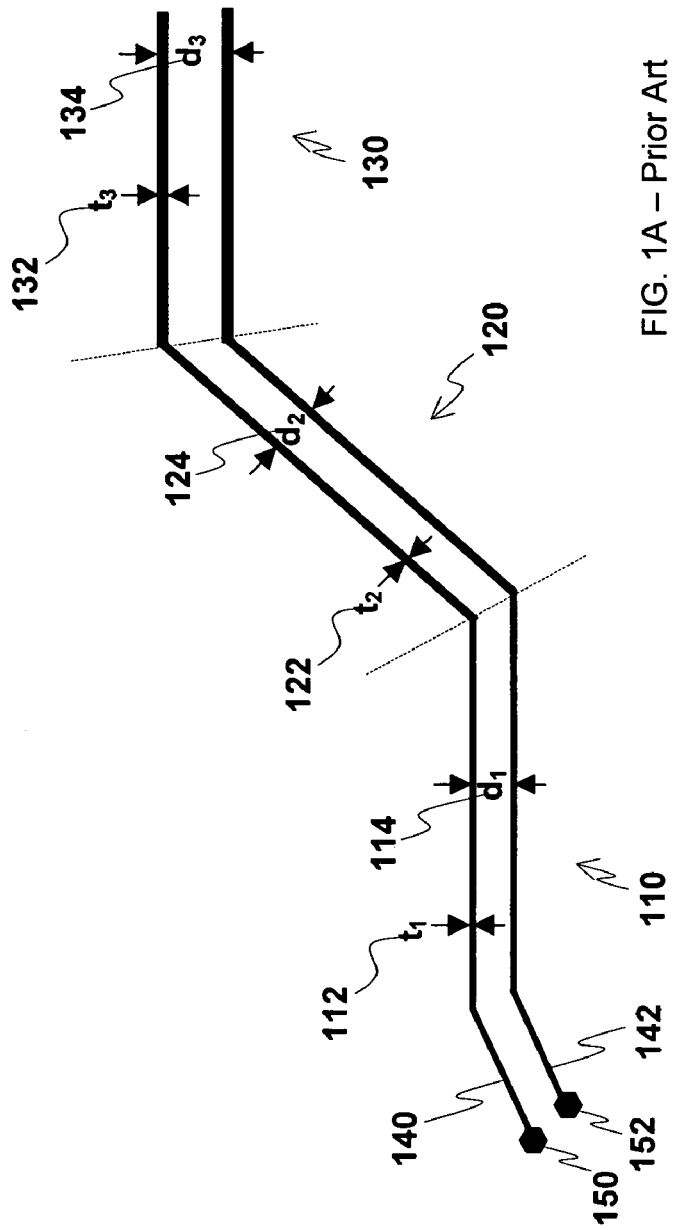
FIG. 1A – Prior Art
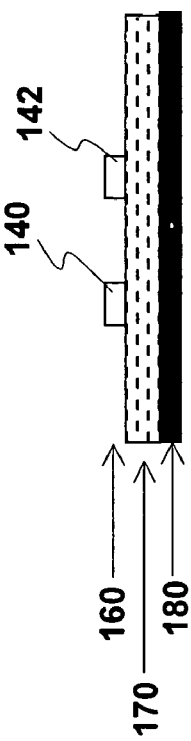
FIG. 1B – Prior Art

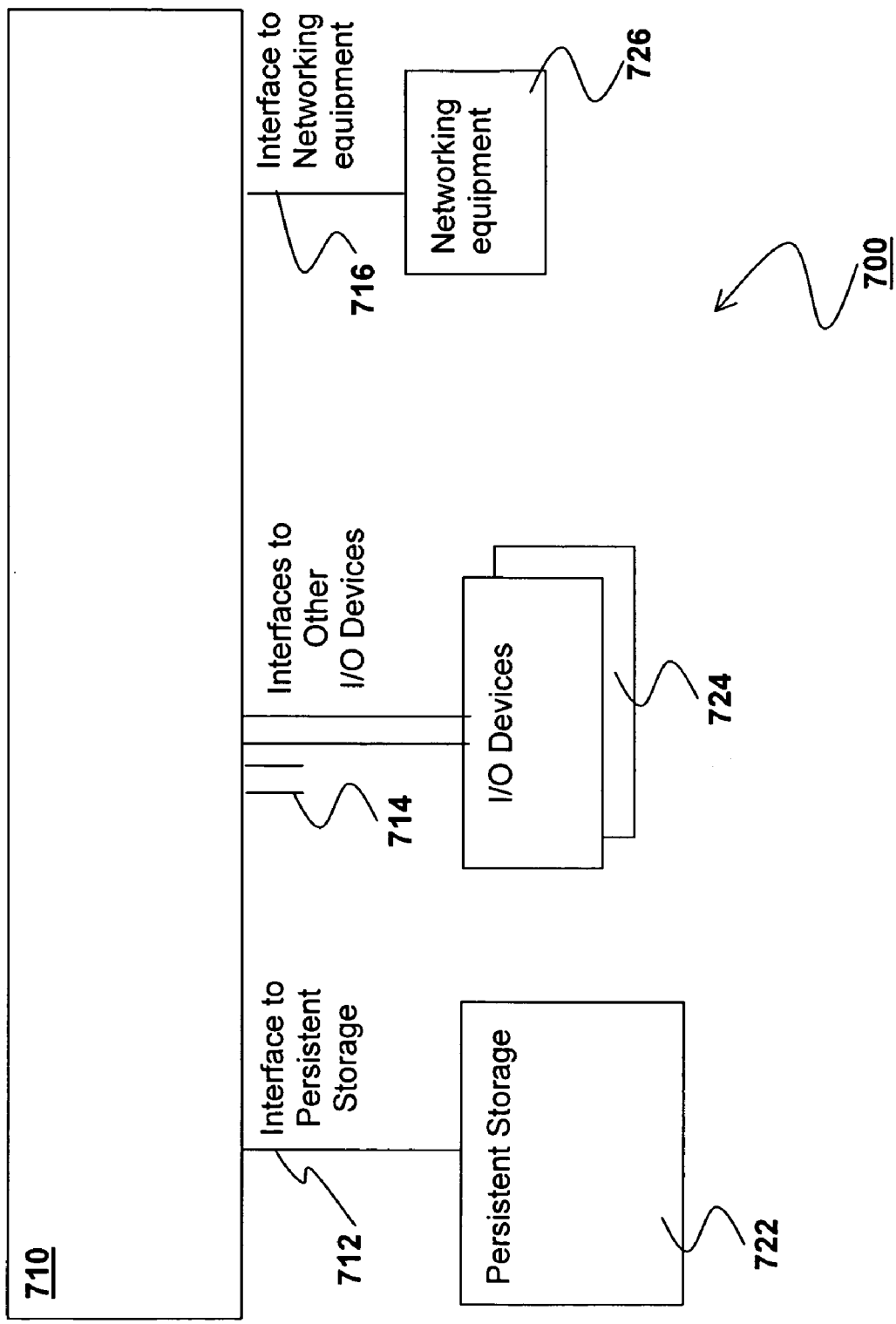

REFERENCE SLOTS FOR SIGNAL TRACES

FIELD OF THE INVENTION

The present invention relates to printed circuit board (PCB) design.

BACKGROUND OF INVENTION

Increasingly complex designs are resulting in challenges to designers of printed circuit boards. Printed circuit board designs are becoming more complex due to various factors. One factor making printed circuit board designs more complex is related to the increase in the density of integrated circuit devices (i.e. the amount of logic on integrated circuit devices) that are used as part of a printed circuit board assembly. As integrated circuits increase in density, the number of input/output (I/O) signals to those integrated circuits increases while trying to maintain similar footprints on the printed circuit board. Thus, printed circuit boards supporting these increasingly dense integrated circuits become more complex with respect to the increased number of signal traces they support.

BRIEF DESCRIPTION OF DRAWINGS

Embodiments of the present invention will be described referencing the accompanying drawings in which like references denote similar elements, and in which:

FIGS. 1A and 1B illustrate a top view and a cross section view of a portion of a prior art printed circuit board design.

FIG. 7 illustrates a system included a printed circuit board having reference slots, in accordance with one embodiment.

DETAILED DESCRIPTION OF THE EMBODIMENTS

Figure 2A:
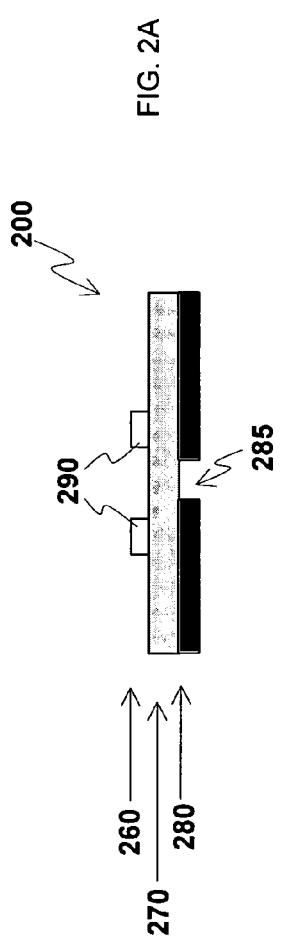
FIGS. 2A and 2B illustrate views of a printed circuit board design including a slot in the reference plane, in accordance with one embodiment.

In the following detailed description, a novel method and apparatus for utilizing a reference slot (i.e., a slot in a reference plane) are disclosed In this description, mention is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

FIGS. 1A and 1B illustrate a top view and a cross section view of a portion of a prior art printed circuit board design. Illustrated in FIG. 1A are two signal traces 140 142 routed parallel to each other for the portion of the printed circuit board design. FIG. 1B illustrates a cross section of one region showing a signal layer 160, a dielectric layer 170 and a reference plane 180. The signal layer contains signal traces 140 142. The reference plane 180 may be coupled to ground or some other reference voltage. The reference plan may provide a reference voltage for the printed circuit board design.

The signal traces originate in a breakout region 110, i.e., from an area with connections 150 152 to a silicon device (not illustrated). For example, the connections 150 152 may be pads to connect a surface mount device to the printed circuit board. In the breakout region 110, the traces 140 142 may each have a certain thickness $t_1$ 112. In addition the traces 140 142 may have distance $d_1$ 114 between each other. As the signal traces 140 142 leave the breakout region 110 and transition to a second region 120, the trace thickness, $t_2$ 122, increases and the distance, $d_2$ 124, between traces increases. As signals 140 142 fanout to a third region 130, the trace thickness $t_3$ 132 further increases as does the distance $d_3$ 134 between traces.

The increase in thickness of the signal traces may provide for, among other things, increased signal integrity in terms of reducing loss in signals transmitted on the signal traces. As the trace width increases in a new region, if the distance between the signals is not increased, the impedance of the traces in this new region may not match the impedance of the previous region. This may occur, for example, due to differential impedance between the signal traces. To provide for the ability to match impedances between regions, in this prior art design, the spacing between the signal traces is increased as the signal trace widths are increased.

However, the increased distance between the signal traces may reduce the ability to perform high density routing of signal traces on the printed circuit board. Since more space is necessary between the traces, the lower the total number of signals that may successfully be routed on the printed circuit board during layout, given the spacing rules for a printed circuit board technology. By reducing the spacing between signal traces on a circuit, it may be possible to increase the number of signals that can be successfully routed.

In addition, in a breakout region of a design, with trace widths reduced to a value that still provides enough signal integrity and a desired target impedance, there is a limit to the minimum separation on signals in the breakout region. This in turn limits the density of pins on a device connected to the printed circuit board, e.g., at pads 150 152. Thus, to increase the number of input/output signals, and thus the number of pins, on a device, the device package increases in size. This may be undesirable for a number of reasons.

FIG. 2A illustrates a cross sectional view of a printed circuit board design including a slot in the reference plane, in accordance with one embodiment. Illustrated are signal trace pair 290 in a signal layer 260. Also illustrated is a dielectric layer 270 and reference plane 280. In one embodiment, the signal trace pair 290 may carry differential signal pairs. As such, the traces may originate at approximately the same location on a printed circuit board and terminate at approximately the same location on a printed circuit board. For example, a differential signal pair may source from closely spaced output pins of a processor and terminate at closely space input pins of a networking device. To improve common mode noise rejection between signals carried on the differential signals carry to the signal trace pair 290, the signal traces may be routed on the printed circuit board substantially parallel to each other from source to termination.

Figure 2B:
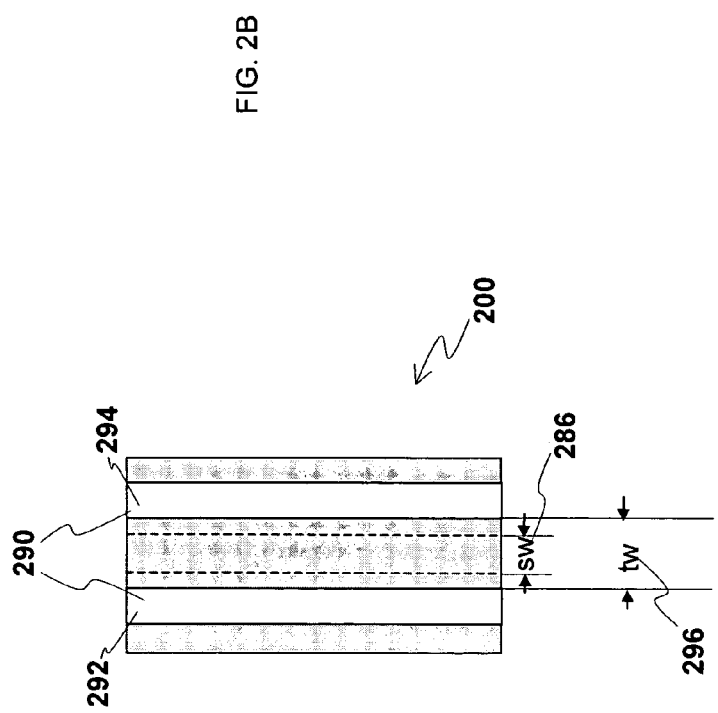

As illustrated, the design includes a slot 285 in the reference plane 280 (i.e., a reference slot) that runs substantially parallel to the signal trace pair 290 and is centered between the signal trace pair 290. FIG. 2B illustrates a top level view of a printed circuit board design illustrating the signal trace pair 290 as well as the slot (hidden) which runs substantially parallel to the signal traces but along an opposite side of dielectric 270. Signal trace pair 290 comprises two substantially parallel signal traces 292 294. The two substantially parallel signal traces 292 294 are separated by a trace width TW 296. The slot width, SW 286, in the reference plane is also illustrated. While the embodiment has illustrated the reference slot as being centered between the signal trace pair, in alternative embodiments the reference slot may be off center.

References slot 285 advantageously provides for reduced impedance for signals traveling on signal traces 290. For a desired impedance on signal traces 290 with a given trace width, there is a limit to the distance between signal traces. However, by utilizing a reference slot parallel to the signal traces, the impedance in the signal traces can be reduced. Thus, signal traces that are routed in high density areas of a printed circuit board may be laid-out closed together, while keeping the same impedance as traces further apart but with no reference slot. The width of the reference slot may determine the effect of the impedance change on the signal traces. A wider slot width may result in a further decreased impedance.

Figure 3:
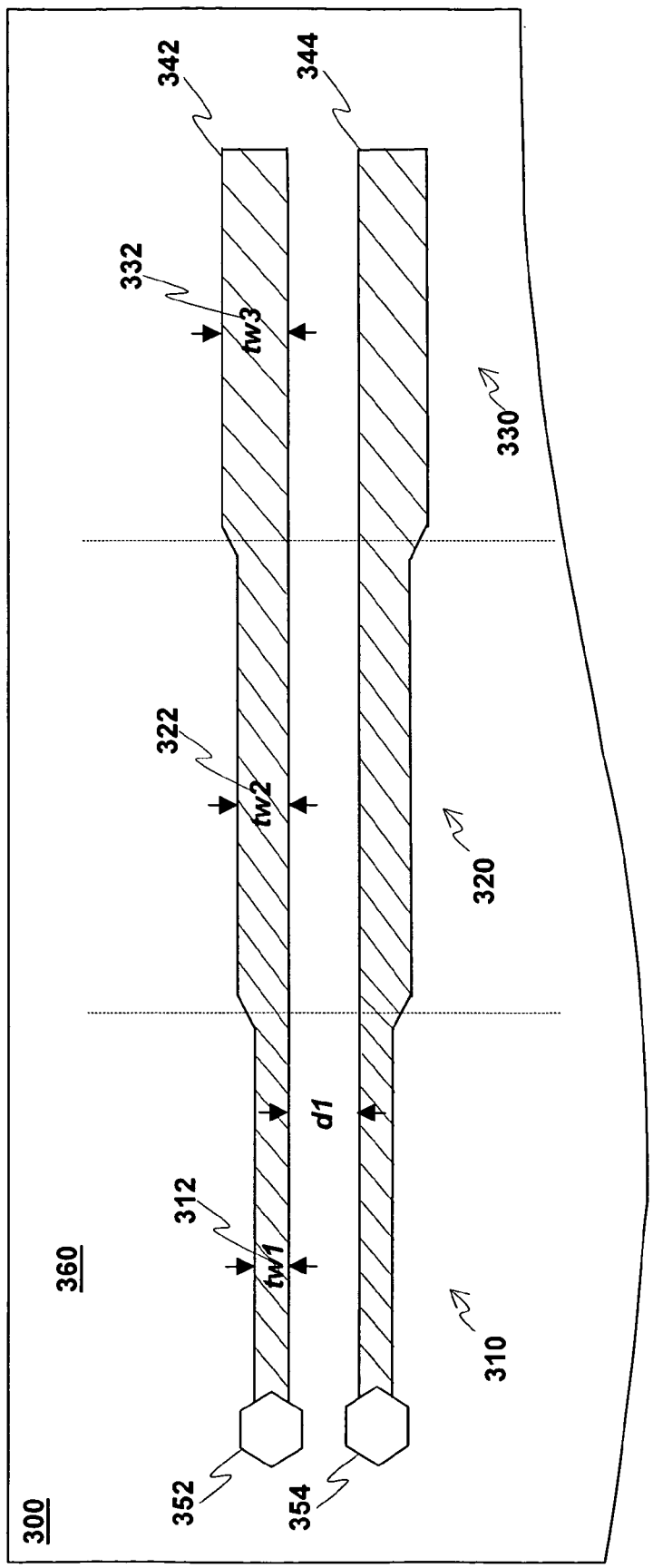
FIG. 3 illustrates a top view of a portion of a printed circuit board utilizing reference slots, in accordance with one embodiment.

FIG. 3 illustrates a top view of a portion of a printed circuit board 300 utilizing reference slots, in accordance with one embodiment. Illustrated are multiple regions 310 320 330 through which signal traces 342 344 pass. As the signal traces 342 344 move further away from breakout region 310, e.g. from a region with connections 352 354 to a silicon device (not illustrated), the trace width of the signal traces 342 344 increases. Thus, in a second region 320 the trace width, w2 322, is greater than in the breakout region 310. In a fanout region 330, the trace width, w3 332, is greater than in the second region 320.

In comparison to the prior art design described in connection with FIG. 1, in the embodiment illustrated in FIG. 3, when the traces increase in thickness as they pass from region to region, the spacing between the traces 314 may, in one embodiment, remain substantially constant. Utilizing reference slots, impedance matching can be obtained between regions without the need to change the spacing between traces. This may result in the ability to have more dense signal trace layout over a printed circuit board.

Figure 4C:
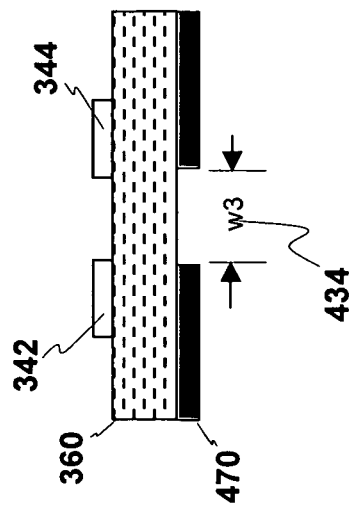
FIGS. 4A–4C illustrate cross sectional views of regions of the portion of a printed circuit board of FIG. 3.
Figure 4B:
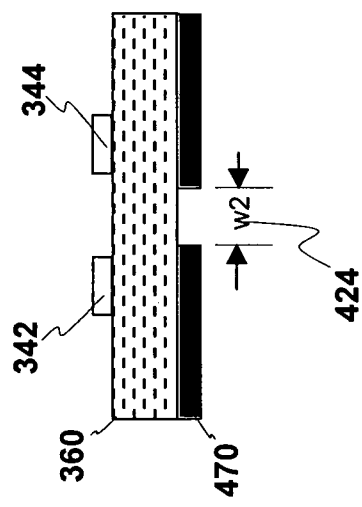
Figure 4A:
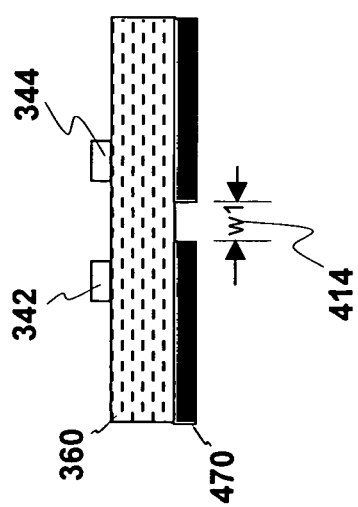

FIGS. 4A–4C illustrates cross sectional views of regions of the portion of a printed circuit board of FIG. 3. FIGS. 4A, 4B and 4C correspond to cross sectional views of regions 310, 320, and 330, respectively. Each cross section illustrates signal traces 342 344 which change width as the regions change. Also illustrated is dielectric 360 separating a signal layer, containing traces 342 344, from reference plane 470. By adaptively changing the width of slots in the reference plane, the impedance associated with corresponding signal traces may be modified. For example, in the embodiment illustrated, signal traces 342 344 have a trace width, tw1 312, in a first region 310. To achieve a particular impedance, for example 80 ohms, a corresponding slot with width w1 414 is placed in the reference plane 470. The determination of a slot width to provide a particular impedance may be empirically ascertained. The signal traces 342 344 have a different width, tw2 322, in a second region 320. In the embodiment illustrated, as a result of the different width, tw2 322, a corresponding slot with width w2 424 is placed in the reference plane 470. This slot width 424 is chosen to result in the impedance in the signal traces 342 344 matching the impedance of the signal traces in the first region 310, i.e., 80 ohms. Similarly, the slot width in the fanout region of the portion of the printed circuit board is chosen to result in a matched impedance of 80 ohms in the fanout region.

Figure 5:
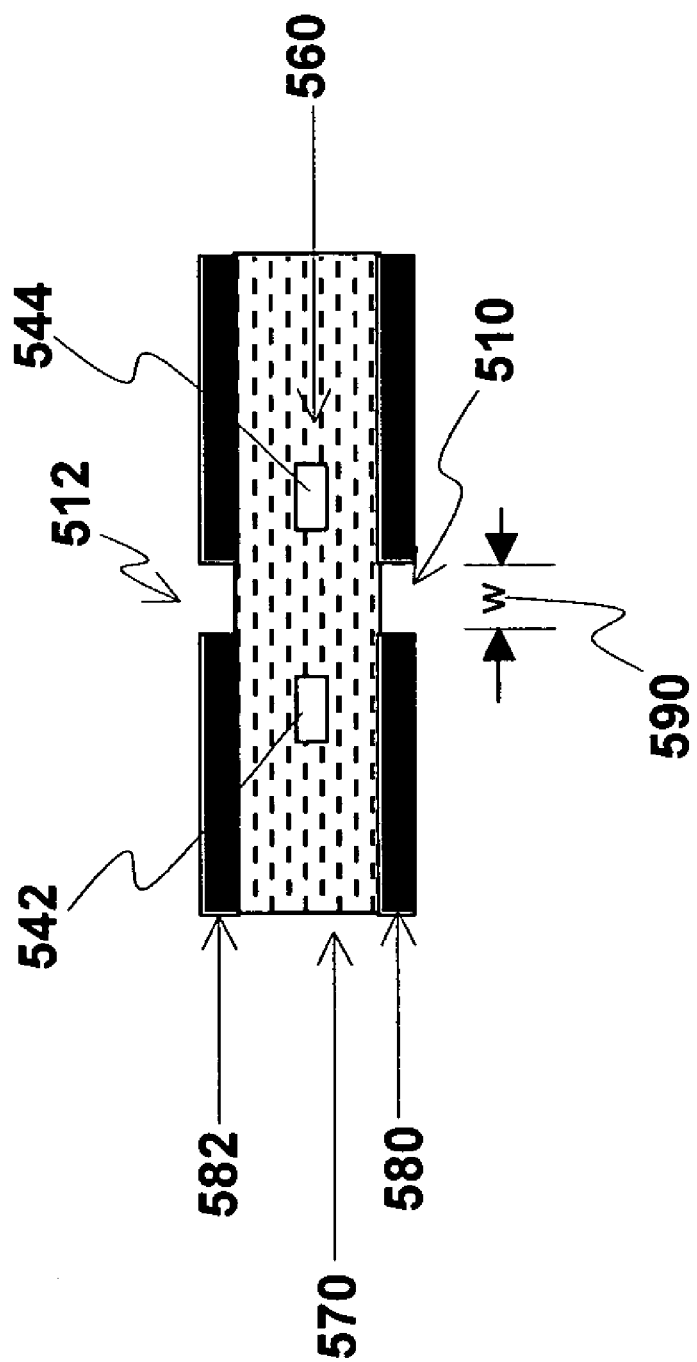
FIG. 5 illustrates a stripline signal trace pair, in accordance with one embodiment.

FIG. 5 illustrates a stripline signal trace pair, in accordance with one embodiment. The stripline signal trace pair 542 544 (e.g. a signal trace pair routed in one of the inner layers) is "between" two reference planes 580 582. That is, as illustrated, a first reference plane 582 is above the stripline signal trace pair 542 544 and a second reference plane 580 is below the stripline signal trace pair 542 544. In the embodiment illustrated, both reference planes 580 582 may contain reference slots 510 512 which run parallel to the signal traces 542 544. In the illustrated embodiment, both reference planes 580 582 have slots 510 512 of equal width 590 to facilitate reduction in the impedance in signal trace pair 542 544. In another embodiment in a stripline design, only one of the reference planes contains a slot. In yet another embodiment, each reference plane contains a slot, however the two slots have different widths.

Figure 6:
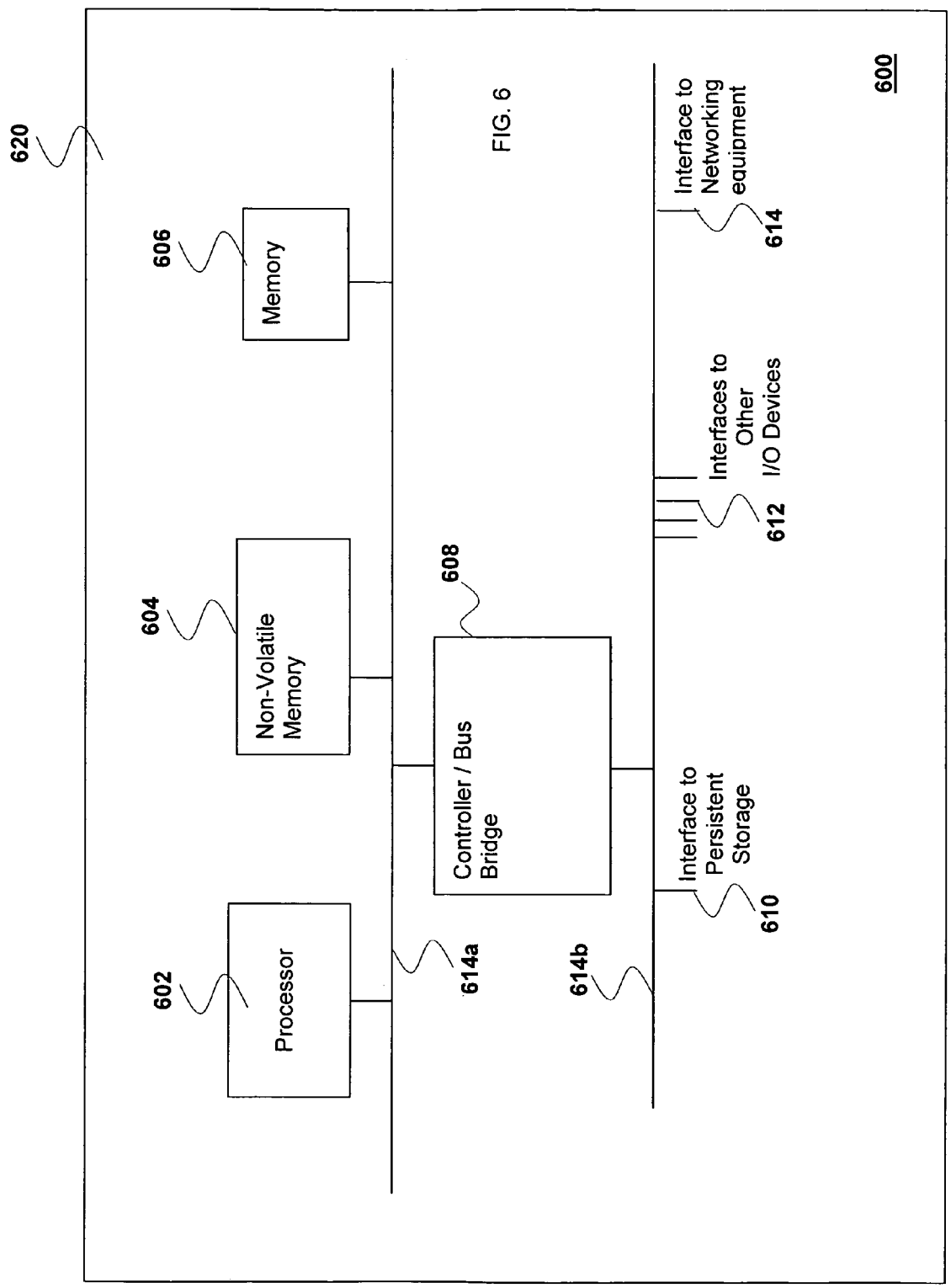
FIG. 6 illustrates a printed circuit board assembly design utilizing an embodiment of the present invention.

FIG. 6 illustrates a printed circuit board assembly 600 utilizing an embodiment of the present invention. For the embodiment, printed circuit board assembly 600 includes printed circuit board 620, includes buses 614a–614b, processor 602, non-volatile memory 604, memory 606, bus bridge 608, interface to persistent storage 610, interface to networking equipment 614 and interfaces to other I/O devices 612 coupled to each other as shown.

Buses 614a–614b comprise a number of signal traces for carrying signals between various devices on the printed circuit board as illustrated. In the embodiment illustrated, a top layer of the printed circuit board 620 contains microstrip traces on a dielectric material. The dielectric material may separate the microstrip traces from a reference plane (not illustrated). Reference slots may be utilized in the reference plane for one or more signal trace pairs to advantageously modify the impedance of signal using the signal trace pairs.

FIG. 7 illustrates a system 700 included a printed circuit board having reference slots, in accordance with one embodiment. System 700 contains a printed circuit board 710. The printed circuit board 710 contains reference slots associated with signal trace pairs, in accordance with one embodiment of the present invention. In addition, the system 700 comprises a number of peripheral devices coupled to the circuit board 710 via various interfaces 712–716. For example, networking equipment 726 may interface to circuit board 710 via a Universal Serial Bus 716. Persistent storage 722 may interface to circuit board 710 via an Parallel Advanced Technology Attachment (UATA-100) interface.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. For example, the above description may apply to other apparatus such as integrated circuits. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
a signal layer including a first and a second signal trace located along a first plane, each of the first and second signal traces comprises a first segment with a first segment width, and a second segment with a second segment width;
a reference layer located along a second plane that is substantially parallel with the first plane coupled to the first and the second signal trace, the reference layer includes a slot substantially parallel to the first and second signal traces, the slot comprising a first portion and a second portion having a first portion width and a second portion width, respectively; and
wherein the first and second portions of the slot correspond to the first and second segments, respectively, of the first and second signal traces.

2. The apparatus of claim 1, further comprising a dielectric layer that is at least partially disposed between the signal layer and the reference layer.

3. The apparatus of claim 1 wherein spacing between the first and the second signal trace remains substantially constant in both the first and second segments.

4. The apparatus of claim 1 wherein each of the first and second signal traces further comprises a third segment with a third segment width and the slot comprises a third portion, comprising a third portion width, corresponding to the third segment of the first and second signal traces.

5. The apparatus of claim 1 wherein the first and second signal traces have a first and a second signal trace width respectively, wherein the first signal trace width is substantially the same as the second signal trace width.

6. The apparatus of claim 1 wherein the signal layer further includes a third and a fourth pair of signal traces and another slot.

7. The apparatus of claim 2 further comprising:
another reference layer located along a third plane that is substantially parallel with the first plane, coupled to the first and the second signal trace, the other reference layer including another slot substantially parallel to the first and second signal traces; and
the dielectric layer is further partially disposed between the signal layer and the other reference layer.

8. An assembly comprising: an apparatus comprising: a signal layer including a first and second signal trace located alone a first plane, each of the first and second signal traces comprises a first segment with a first segment width, and a second segment with a second segment width; a reference layer located along a second plane that is substantially parallel with the first plane coupled to the first and the second signal trace, the reference layer includes a slot substantially parallel to the first and second signal traces, the slot comprising a first portion and a second portion having a first portion width and a second portion width, respectively; and wherein the first and second portions of the slot correspond to the first and second segments, respectively, of the first and second signal traces,
a processor coupled to the apparatus; and a networking interface coupled to the apparatus.

9. The assembly of claim 8 wherein the first and second signal traces are coupled to the processor and a memory device.

10. The assembly of claim 8, further comprising a dielectric layer that is at least partially disposed between the signal layer and the reference layer.

11. The assembly of claim 8 wherein spacing between the first and the second signal trace remains substantially constant in both the first and second segments.

12. The assembly of claim 10 further comprising:
another reference layer located along a third plane that is substantially parallel with the first plane, coupled to the first and the second signal trace, the other reference layer including another slot substantially parallel to the first and second signal traces; and the dielectric layer is further partially disposed between the signal layer and the other reference layer.

13. The assembly of claim 8 wherein the first and second signal trace are to facilitate propagation of a differential signal pair.

14. A system comprising: an assembly comprising: an apparatus comprising: a signal layer including a first and second signal trace; located along a first plane, each of the first and second signal traces comprises a first segment with a first segment width, and a second segment with a second segment width; a reference layer located along a second plane that is substantially parallel with the first plane coupled to the first and the second signal trace, the reference layer includes a slot substantially parallel to the first and second signal traces, the slot comprising a first portion and a second portion having a first portion width and a second portion width, respectively; and wherein the first and second portions of the slot correspond to the first and second segments, respectively, of the first and second signal traces and a processor coupled to the apparatus; and a networking device coupled to the assembly.

15. The system of claim 14 wherein the a assembly further comprises a networking interface, wherein the networking interface is coupled to the networking device.

16. The system of claim 14 wherein the assembly further comprises an interface to a persistent storage and wherein the system further comprises the persistent storage coupled to the interface to the persistent storage.

17. A method of routing circuit board traces comprising: routing a first signal trace and a second signal trace along a first plane of a circuit board, each of the first and second signal traces comprises a first segment with a first segment width, and a second segment with a second segment width; and routing a slot in a reference layer located along a second plane of the circuit board that is substantially parallel with the first plane coupled to the first and the second signal trace, the slot is substantially parallel to the first and the second signal traces the slot comprising a first portion and a second portion having a first portion width and a second portion width, respectively and wherein the first and second portions of the slot correspond to the first and second segments, respectively, of the first and second signal traces.

* * * * *

UNITED STATES PATENT AND TRADEMARK OFFICE
CERTIFICATE OF CORRECTION

PATENT NO. : 7,110,263 B2  Page 1 of 1
APPLICATION NO. : 10/797753
DATED : September 19, 2006
INVENTOR(S) : He et al.

It is certified that error appears in the above-identified patent and that said Letters Patent is hereby corrected as shown below:

Figures 2A & 2B
[Ref no.] 200 should be deleted.

Figure 5
[Ref no.] 560 should be deleted.

Figure 7
[Ref no.] 724 should be deleted.

Column 3
Line 8, "...dielectric 270..." should read --...dielectric layer 270...--.
Line 43, "...traces 314..." should read --...signal traces 324 344...--.

Column 4
Line 4, "...the slot width..." should read --...the slot width 434...--.
Line 10-11, "...the inner layers..." should read --...the inner layers 570...--.

Column 5
Lines 43-46, "8. ...located alone..." should read --8. ...located along...--.

Column 6
Lines 37, "...the a assembly..." should read --...the assembly...--.

Signed and Sealed this

Fifteenth Day of July, 2008

JON W. DUDAS
*Director of the United States Patent and Trademark Office*